United States Patent [19]

Brinker, Jr.

[11] Patent Number: 4,814,549

[45] Date of Patent: Mar. 21, 1989

[54] BEND ENHANCEMENT OF FLEXIBLE MULTILAYER CABLES

[75] Inventor: Berton B. Brinker, Jr., Los Angeles, Calif.

[73] Assignee: Hughes Aircraft Company, Los Angeles, Calif.

[21] Appl. No.: 137,261

[22] Filed: Dec. 23, 1987

[51] Int. Cl.[4] ............................................. H02G 1/00
[52] U.S. Cl. .................................... 174/135; 156/226; 174/71 R
[58] Field of Search ............ 174/70 C, 71 R, 117 FF, 174/135; 29/868, 423, 445; 156/50, 204, 226, 227; 403/41, 185, 206, 207, 216, 382, 390

[56] References Cited

U.S. PATENT DOCUMENTS 4,665,280  5/1987  Bowen .............................. 174/71 R Primary Examiner—Laramie E. Askin
Attorney, Agent, or Firm—L. B. Sternfels; W. J. Streeter; A. W. Karambelas

[57] ABSTRACT

Layers (12, 14) of a multilayer flexible cable (10) are directed about a bend (22), so that the layers are configured into inner (12) and outer (14) layers. Differently configured spacers (20, 72, 74, 76) are placed between the respective layers at the bend for guiding the outer layer in a path (24) which follows the bend and for guiding the inner layer or layers in a path (26) or paths which is or are generally reversely directed from that of the outer layer.

11 Claims, 1 Drawing Sheet

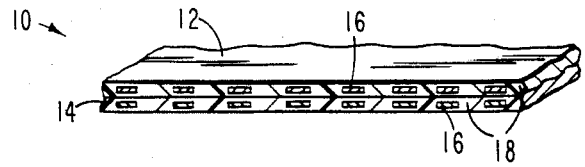
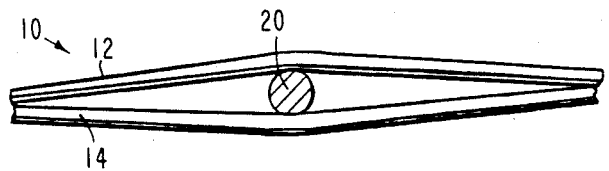
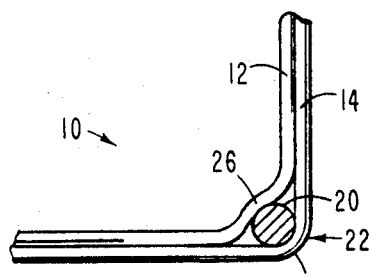
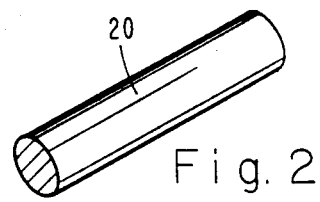
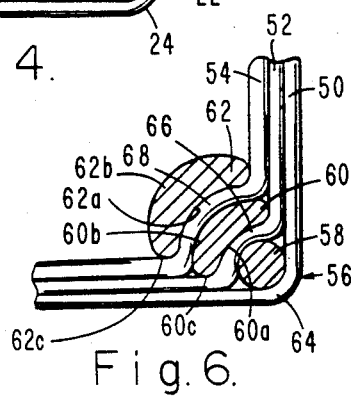
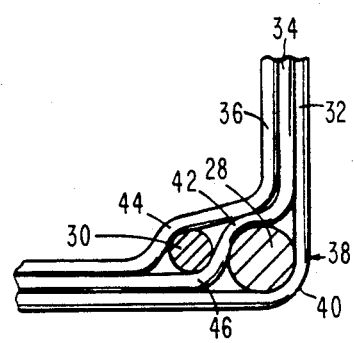
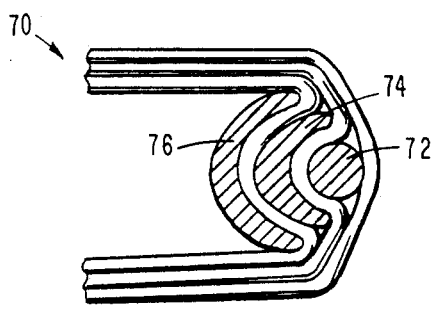
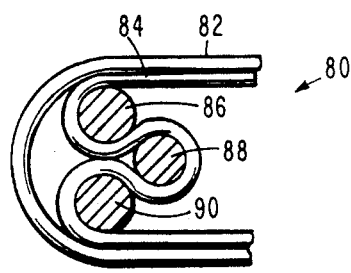

BEND ENHANCEMENT OF FLEXIBLE MULTILAYER CABLES

BACKGROUND OF THE INVENTION

The present invention relates to flexible multilayer cables and, in particular, to a device and a method for directing the bending of such cables.

A major difficulty in the fabrication and use of multilayer flexible cables is the ability to bend them without subjecting the layers to damaging stresses. When such a cable is bent, the outer layer lengthens and the inner layer shortens, so that the inner layer buckles and/or the outer layer is placed in tension. These stresses on the layers increase as the bending angle increses from a flat to an angle of 90° or more.

One method of avoiding such stress is to fabricate the cable with layers of unequal lengths. This method increses both the time and effort and, therefore, the cost, of manufacture, and usually limits the use of such a constructed cable to a particular use. Other solutions include the use of a loose bonding between the layers, for example by stitching, so that one layer may move lengthwise with respect to the other. This solution has some inherent problems, such as the need for lateral alignment between conductors in respective layers. Where such movement between layers is not permissible or possible, e.g., for layers which are bonded together, the stitching solution is not available.

SUMMARY OF THE INVENTION

These and other problems are addressed and overcome in the present invention by disposing a spacer or spacers between layers of the cable where they are bent, for guiding the outer and inner layers in paths which permit the outer to follow the bend and the inner to follow a bend that is generally reverse to that of the outer layer.

Such a spacer may comprise a cylindrical or tubular rod, singly or in combination with other such rods, and/or U-shaped or trough-shaped spacers whose inner and outer surfaces are curved. The curved surfaces may be generally concentric with the rod.

Several aims and advantages are obtained from such instrumentation. The cable assemblies are easier to bend, with reduced or eliminated stresses. Fabrication is simplified in permitting the use of multilayer flexible cables whose layers are equal in length. Use of such spacers generally result in a reduced cost in reduction and assembly of such cable.

Other aims and advantages, as well as a more complete understanding of the present invention, will appear from the following explanation of exemplary embodiments and the accompanying drawings thereof.

DESCRIPTION OF THE DRAWINGS

FIG. 1 is an edge view of a pair of layers of a flat multilayer cable to be bent in accordance with the principles of the present invention;

FIG. 2 is an isometric view of a spacer, configured as a rod or tube, used in facilitating the formation of a bend in the layers depicted in FIG. 1;

FIG. 3 is a view of the layers, similar to that illustrated in FIG. 1, but with the spacer of FIG. 2 placed between the layers at the point where a bend is to be made in the layers;

FIG. 4 is a view of the layers shown in FIG. 3, after having been bent to provide a normal bend in the outer layer, and a reverse bend in the inner layer; and FIGS. 5-8 are views of further embodiments of the present invention, illustrating spacers permitting facile bending of two or three layers which are angled in various and different bending positions.

DETAILED DESCRIPTION OF THE PREFERRED EMBODIMENTS

As shown in FIG. 1, a multilayer flexible cable 10 comprises a pair of layers 12 and 14. Each layer is fabricated in a conventional manner and includes a plurality in conductors 16 embedded in a dielectric 18. At the point where a bend is to be formed in the layers, a spacer 20 (see FIG. 2) is placed between layers 12 and 14, as illustrated in FIG. 3. Such a spacer 20 may comprise a rod or tube of any suitable material, preferably a dielectric material.

When the cable shown in FIG. 3 is bent to provide a fold or bend 22, as depicted in FIG. 4, the layers are configured into inner and outer layers, e.g., layer 14 becomes an outer layer and layer 12 becomes an inner layer. Spacer 20 guides outer layer 14 in a path 24 which follows bend 22. Spacer 20 also guides inner layer 12 in a path 26 which is generally reversely directed from path 24 of the outer layer. Such formation of paths 24 and 26 by spacer 20 effectively eliminates deleterious stresses on layers 12 and 14 of cable 10.

Where there are more than two layers, as shown in FIG. 5, a pair or spacers 28 and 30 are placed between respective contacting layers 32, 34 and 36 at a bend 38. Here, spacer 28 between outer layer 32 and intermediate layer 34 guides layer 32 about a path 40 which follows bend 38, while spacers 28 and 30 guide their respective layers 34, 36 about reverse bends 42 and 44. In addition, spacer 30 causes layer 34 to follow a path 46 which follows generally in the direction of bend 38.

Referring to FIG. 6, cables 50, 52 and 54 are angled about a bend 56 and about spacers 58, 60 and 62. Spacer 58 is shown as being cylindrical in form, while spacers 60 and 62 are U-shaped or trough-shaped, respectively having inner curved surfaces 60a and 62a and outer curved surfaces 60b and 62b. These surfaces are generally connected by rounded edge surfaces 60c and 62c. Surfaces 60a, 60b, 62a and 62b may be concentric with the surface of cylindrical spacer 58. This configuration provides a path 64 of outer layer 50 which generally follows bend 56 while paths 66 and 68 of layers 52 and 54 follow in a generally reverse direction from that of path 64.

FIG. 7 illustrates a 180° reverse turn of a cable assembly 70, as distinguished from the 90° bends shown in FIG. 4-6. Here, the three cables are bent about a cylindrical spacer 72, and a pair of U-shaped or trough-shaped spacers 74 and 76. Spacers 74 and 76 are essentially like spacers 60 and 62 depicted in FIG. 6.

FIG. 8 illustrates a different embodiment for providing a 180° bend in a cable assembly 80, which comprises a pair of layers 82 and 84. In this embodiment, three cylindrical spacers 86, 88 and 90 are provided to form inner cable 84 in a double-S configuration.

The several spacers disclosed herein may be retained in position by bonding with a suitable adhesive or by using threads or other ties. If desired, the spacers may be loosely placed between the layers and then removed after the bends have been made.

Although the invention has been described with respect to particular embodiments thereof, it should be realized that various changes and modifications may be made therein without departing from the spirit and scope of the invention.

I claim:

1. A combination of a multilayer flexible flat cable having a bend therein and instrumentation for directing the layers thereof about said bend, so that the layers are configured into inner and outer layers, comprising elongate means disposed between the layers and orthogonal to and at the bend for guiding the outer layer in a path which follows the bend and for guiding the inner layer in a path which is generally reversely directed from that of the outer layer.

2. The combination according to claim 1 in which said means comprises spacing means positioned between the layers for spacing the layers apart.

3. The combination according to claim 2 in which said spacing means is configured to define the bend into a desired configuration of the cable.

4. A combination of a multilayer flexible flat cable having a bend therein and instrumentation for directing the layers thereof about said bend, so that the layers are configured into inner and outer layers, comprising elongate means disposed between the layers orthogonal to and at the bend for guiding the outer and inner layers in paths which respectively follow and generally reversely follow the bend.

5. A method for directing layers of a multilayer flexible flat cable about a bend therein, so that the layers are configured into inner and outer layers, comprising the steps of guiding the outer layer in a path which follows the bend and guiding the inner layer in a path which is generally reversely directed from that of the outer layer.

6. A method according to claim 5 further comprising the steps of positioning elongate means orthogonal to the bend between the layers for spacing the layers apart and configuring the spacing means to define the bend into a desired configuration of the cable.

7. A combination of a multilayer flexible cable having a bend therein and instrumentation for directing the layers thereof about said bend, so that the layers are configured into inner and outer layers, comprising a tube positioned between the layers at the bend for spacing the layers apart and for guiding the outer layer in a path which follows the bend and for guiding the inner layer in a path which is generally reversely directed from that of the outer layer.

8. A combination of a multilayer flexible cable of at least three layers having a bend therein and instrumentation for directing the layers thereof about said bend, so that the layers are configured into one outer layer and a plurality of inner layers, comprising a cylindrical spacer positioned between the outer layer and the inner layer adjacent thereto and a generally U-shaped spacer positioned between each of the inner layers at the bend for spacing the layers apart and for guiding the outer layer in a path which follows the bend and for guiding the inner layers in paths which are generally reversely directed from that of the outer layer.

9. The combination according to claim 8 in which each said U-shaped spacer has curved inner and outer surfaces which are generally concentric with said cylindrical spacer.

10. The combination according to claim 9 in which each said U-shaped spacer has curved ends joining said inner and outer surfaces.

11. A combination of a multilayer flexible cable of at least three layers having a bend therein and instrumentation for directing the layers thereof about said bend, so that the layers are configured into an outer layer and a plurality of inner layers, comprising a plurality of cylindrical spacers positioned respectively between the layers at the bend for spacing the layers apart and for guiding the outer layer in a path which follows the bend and for guiding the inner layers in paths which are generally reversely directed from that of the outer layer.

* * * * *